United States Patent [19]
Dent

[11] Patent Number: 5,066,927
[45] Date of Patent: Nov. 19, 1991

[54] DUAL MODULUS COUNTER FOR USE IN A PHASE LOCKED LOOP

[75] Inventor: Paul Dent, Stehag, Sweden

[73] Assignee: Ericsson GE Mobile Communication Holding, Inc., Paramus, N.J.

[21] Appl. No.: 578,259

[22] Filed: Sep. 6, 1990

[51] Int. Cl.⁵ .................. H03K 21/00; H03K 7/18
[52] U.S. Cl. ............................ 331/1 A; 331/16; 331/25; 377/48; 377/52
[58] Field of Search ............... 331/1 A, 16, 25; 377/47, 48, 52; 364/703

[56] References Cited

U.S. PATENT DOCUMENTS

| | | | |
|---|---|---|---|
| 4,053,739 | 10/1977 | Miller et al. | 364/703 |
| 4,184,068 | 1/1980 | Washburn | 235/92 CC |
| 4,316,151 | 2/1982 | Ooms | 331/1 A |
| 4,325,031 | 4/1982 | Ooms et al. | 331/1 A |
| 4,390,960 | 6/1983 | Yamashita et al. | 364/703 |
| 4,468,797 | 8/1984 | Shin | 377/52 |
| 4,658,406 | 4/1987 | Pappas | 377/48 |
| 4,856,032 | 8/1989 | Klekotka et al. | 331/1 A X |
| 4,891,825 | 1/1990 | Hansen | 377/52 |

Primary Examiner—Siegfried H. Grimm
Attorney, Agent, or Firm—Burns, Doane, Swecker & Mathis

[57] ABSTRACT

In a phase locked loop having a variable divider, a dual modulus counter is used to provide the variable divider with selection signals. The variable divider is capable of providing an overall division ratio in increments of one over a contiguous range of values. The dual modulus counter includes a counter, a comparator and logic gates which generate selection signals that allow the variable divider to divide an input signal by at least division ratios R1 and R2. A phase locked loop utilizing the dual modulus counter is particularly well suited for use in a digital frequency synthesizer.

14 Claims, 4 Drawing Sheets

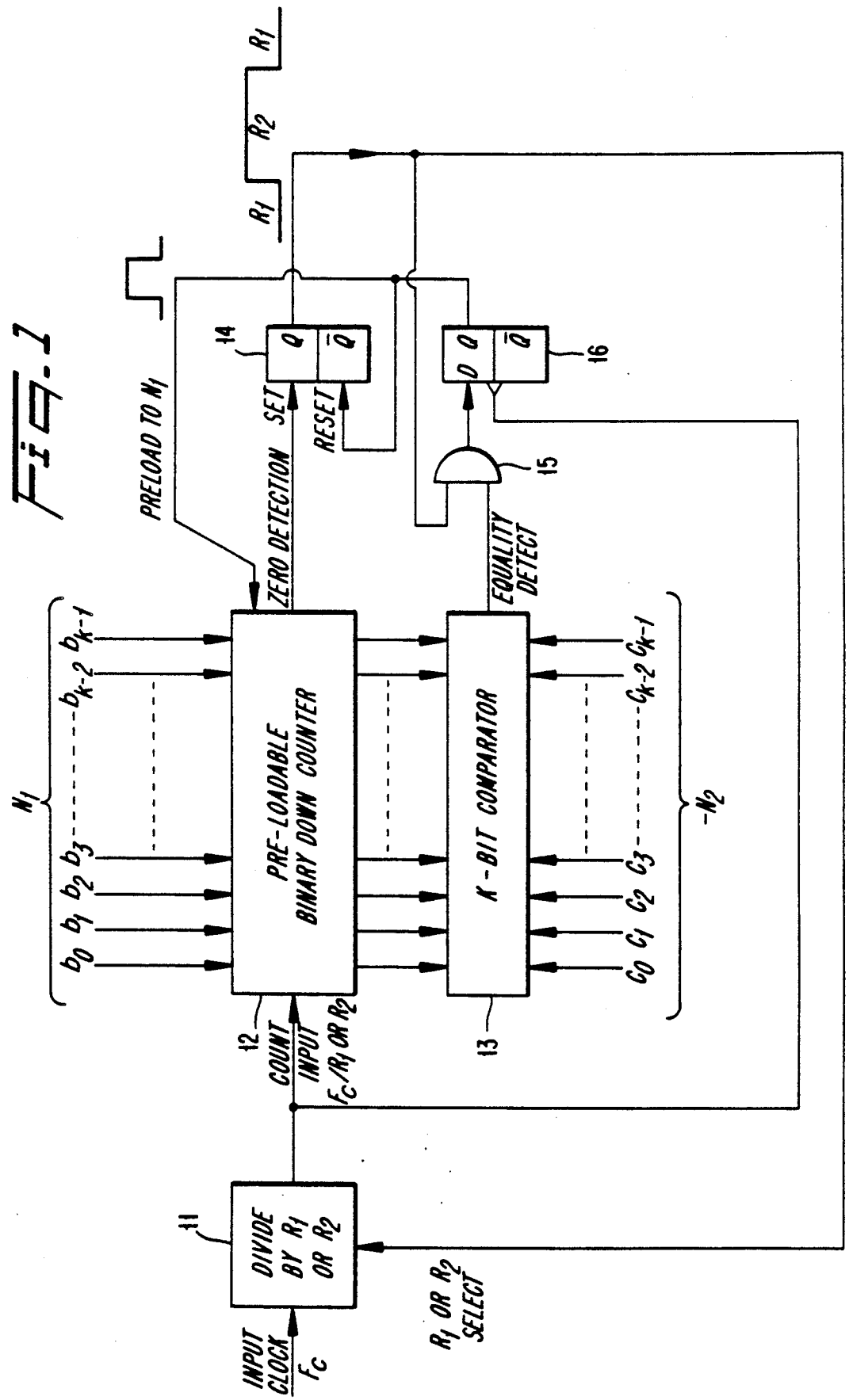

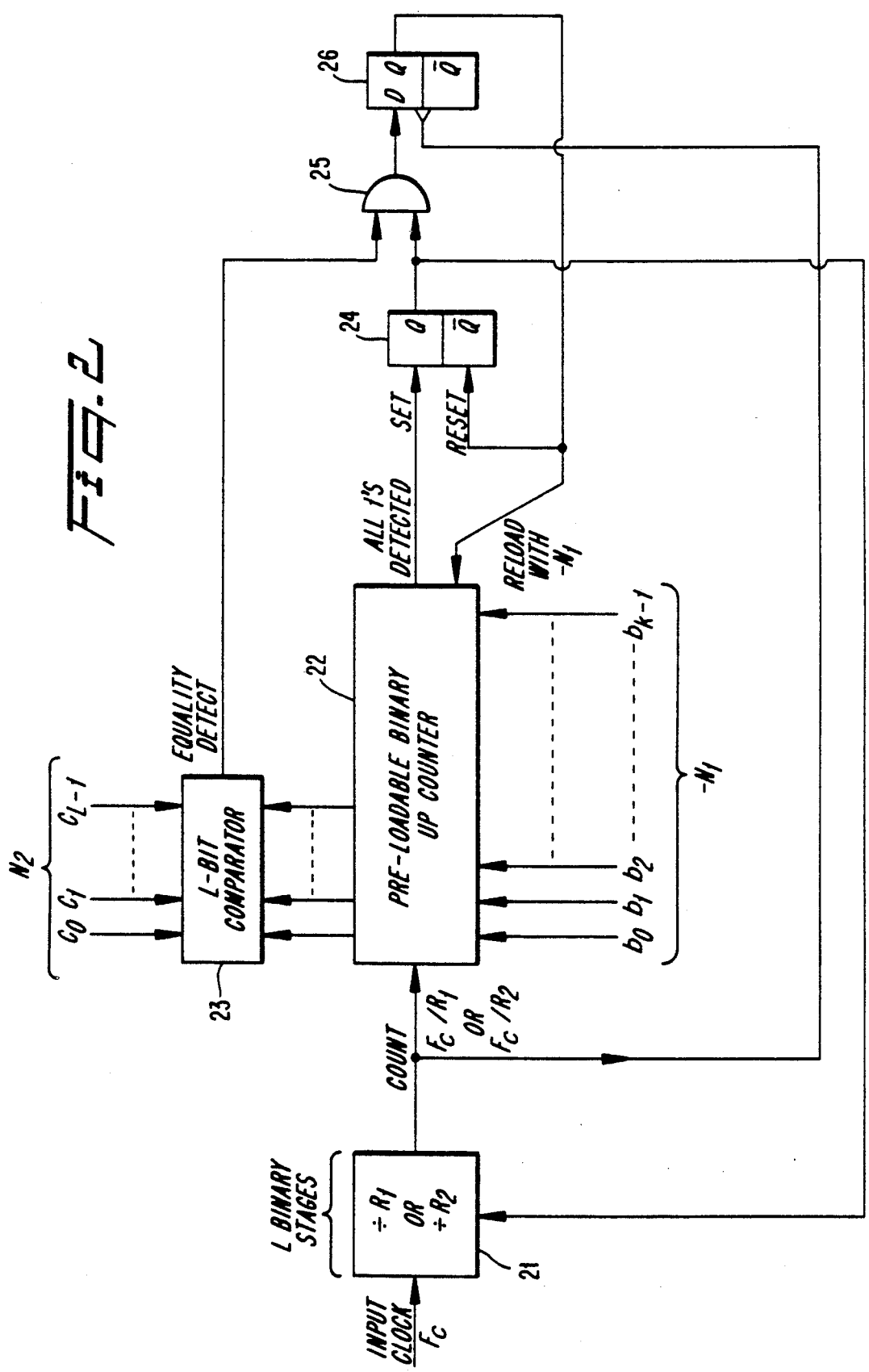

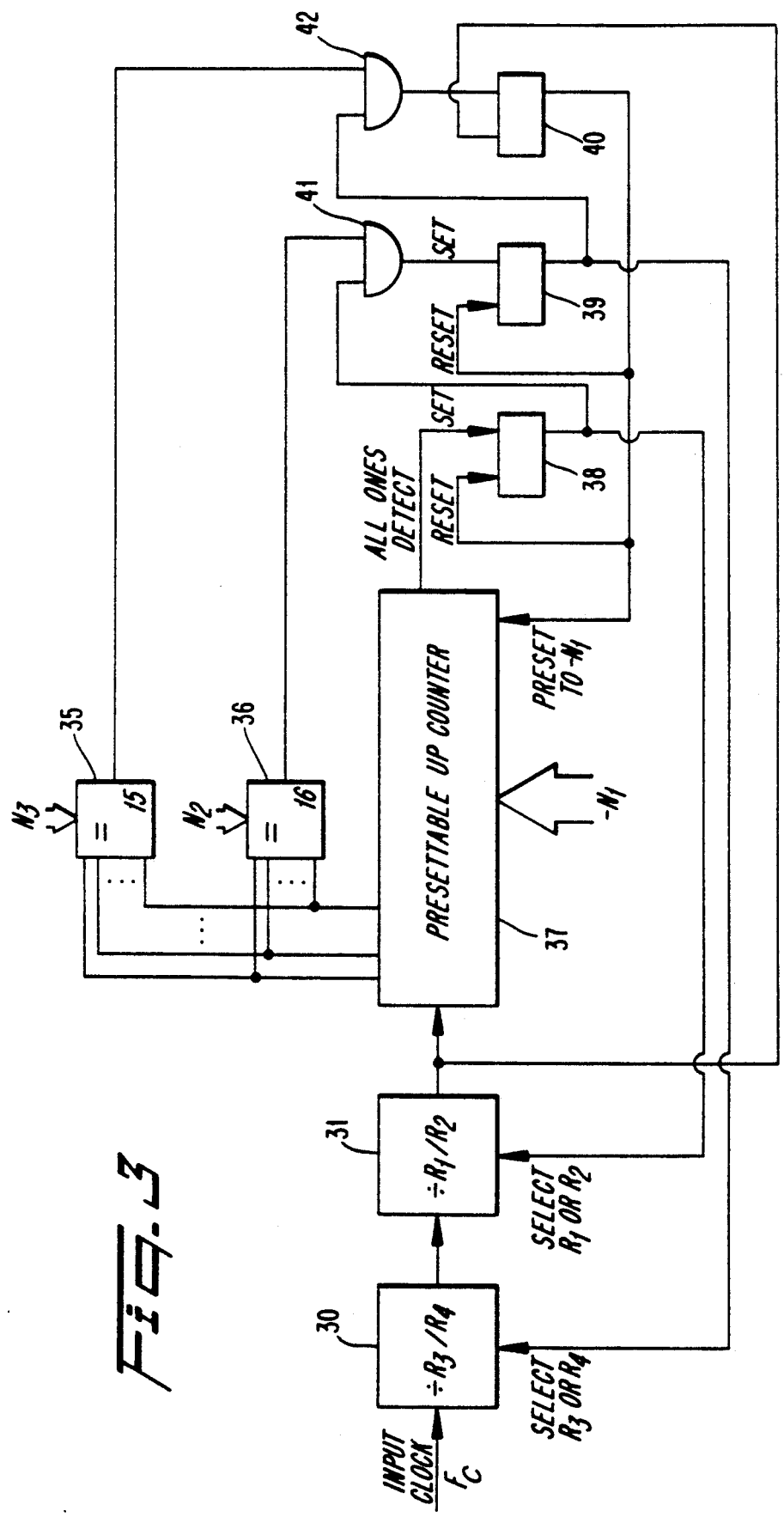

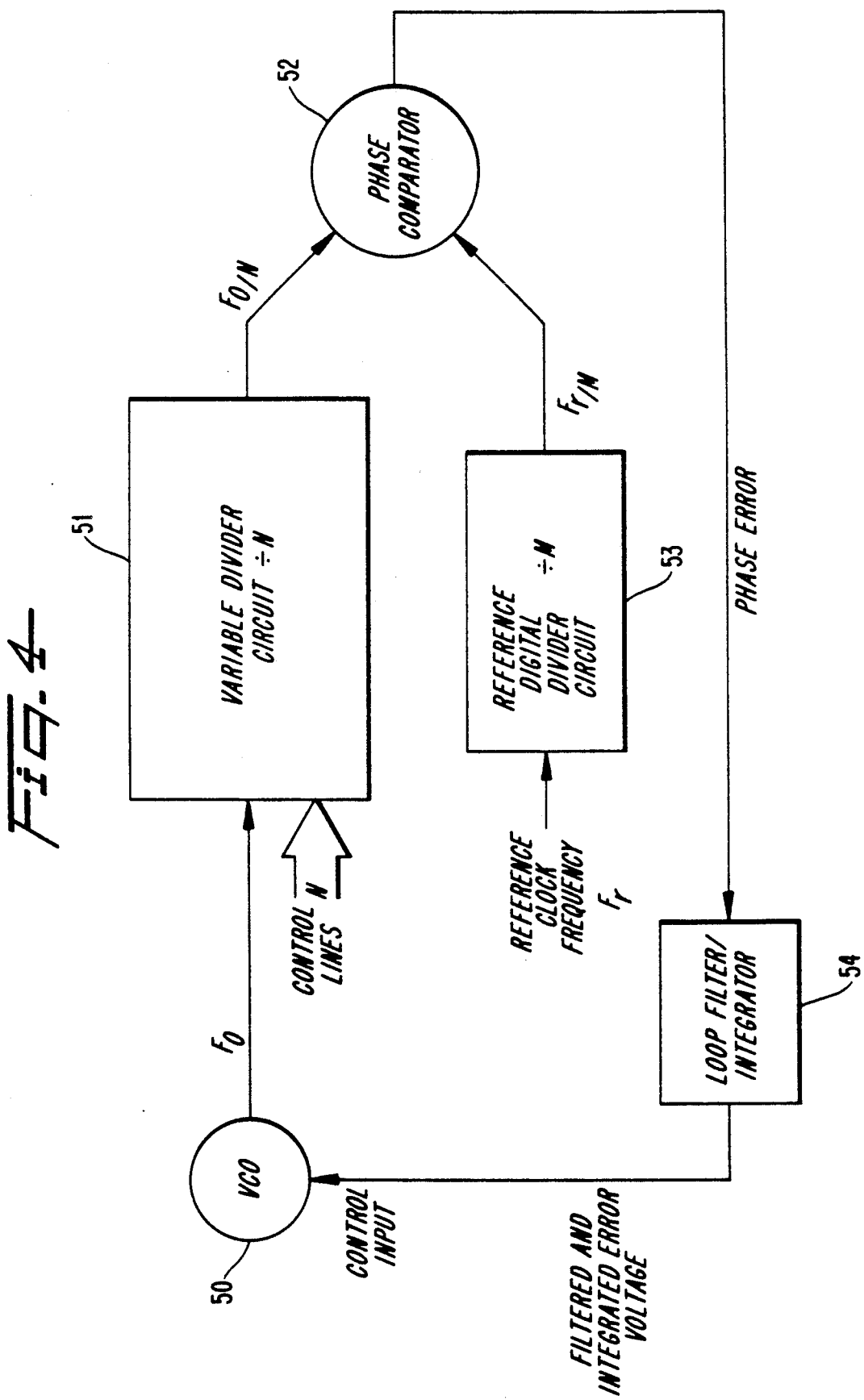

DUAL MODULUS COUNTER FOR USE IN A PHASE LOCKED LOOP

FIELD OF THE INVENTION

The present invention relates generally to a programmable divider for use in a digital frequency synthesizer. More particularly, the invention relates to a dual modulus counter suitable for controlling the programmable divider.

BACKGROUND OF THE INVENTION

In digital frequency synthesizers, there is a need for a variable divider which counts the cycles of an input signal having a given frequency until a predetermined number of counts have been accumulated. The size of the count is usually referred to by the letter N. Once N counts have been accumulated, the variable divider is reset to begin the cycle again. It is desirable for the number of counts N to be variable in order that it can be programmed in advance of each count by means of a control input.

When N is large and the operating frequency of the counter is to be high, technical difficulties can arise in constructing a multistage high frequency variable divider. In the prior art, the problem is typically overcome by using a fixed high frequency divide by M stage prior to a variable divide by N stage. This solution is not always desirable because the total division factor can only be a multiple of M.

In a digital frequency synthesizer application, it is usually desirable to be able to program the total division factors in steps or increments of 1. The steps, therefore, relate to the frequency resolution or the frequency step size of the synthesizer. If the divider is only programmable in steps of M, the frequency steps available are relatively coarse and determined by the factor M.

Another approach to the problem is to begin with a high frequency divider stage or prescaler while retaining the ability to program the divider count cycle length in steps of 1. This arrangement allows the prescaler to be varied between dividing ratios of R and R+1.

It is possible, for example, for a dual ratio prescaler having the division ratios 10 and 11 to perform a division of 157. The number 157 can be expressed by the equation $7 \times 11 + (15-7) \times 10$. The prescaler is first programmed to divide by 11, and the lower frequency divider stage is set to count 7 prescaler output pulses. After counting 7 prescaler output pulses, the prescaler is then set to divide by 10. The low frequency divider stage is then set to count 8 prescaler output pulses. Upon completion of this count, a total of $7 \times 11 + 8 \times 10 = 157$ input pulses have been applied to the prescaler input. The cycle is then begun again. It should be noted that in order to obtain numbers in steps of 1, the number of times the prescaler divides by 11 must be programmed from 0 to 9 and the number of 10's in the total number must not be less than 9. This relationship sets a lower bound of $R(R-1)$ for the contiguous number range that can be achieved with a two ratio prescaler having ratios R and R+1.

The most common method employed to count two different numbers of prescaler output pulses, N1 and N2, while the prescaler is dividing respectively by ratios R1 and R2, is to use two separate low frequency down counters that are preset to the values N1 and N1+N2, respectively. For example, the division of 157 with the aid of a 10/11 prescaler could be achieved by presetting one divider to N=7 and the other to N1+N2=15. The prescaler would then first be set to divide by R1(11) while both low frequency counters counted down on the prescaler output pulses. When the N1 counter reaches zero after 7 prescaler output pulses, the prescaler would switch and divide by 10, and the N2 counter would continue to count down a further 8 prescaler output pulses until it reaches zero, completing the cycle. This system has the advantage that a desired division number is simply expressed in values to which the N1 and N2 counters can be preset. This arrangement has the disadvantage that two variable dividers are required and power consumption is increased when both dividers are operating. Increased power consumption is a significant disadvantage for battery powered equipment.

U.S. Pat. No. 4,053,739 describes a single variable divider that is alternatively programmed with the value N1 when the prescaler divides by the value R1 and is programmed with the value N2 when the prescaler divides by the value R2. This device has the advantage that a single variable divider suffices. Unfortunately, the described arrangement includes additional circuit complexity in the form of a multi-line switch. The multi-line switch alternately selects the bits corresponding to the values N1 and N2 in order to preset the single variable divider. Although this additional circuitry operates at a lower power consumption than a circuit having two variable dividers, it still requires substantially the same amount of circuitry when implemented as an integrated circuit.

Accordingly, there is a need for a counter for a programmable divider which can register both the counts N1 and N2 without them being presented alternately to the counter. This arrangement would eliminate the need for a complex multi-line switch.

SUMMARY OF THE INVENTION

The present invention relates to a circuit and method for controlling a programmable divider for use in a digital frequency synthesizer. The programmable divider is responsive to a dual modulus counter. The dual modulus counter includes a preloadable binary counter, a comparator and logic gates which generate selection signals to control the programmable divider. The preloadable counter is loaded with a value N1. The counter counts to a predetermined intermediate value such as zero and generates an output signal. The counter then continues to count until it reaches a second value N2. The comparator compares the output of the counter to the value N2 which was loaded into the comparator. When the binary counter reaches the value N2, the comparator generates a second output with is applied to the logic gates. The logic gates generate the selection signals which cause the programmable divider to divide an input signal by the division ratios R1 or R2. In a first embodiment of the present invention, the binary counter is a down counter. In a second embodiment of the present invention, the binary counter is an up counter. The dual modulus counter of the present invention may also be used to control more than one programmable divider. The present invention is particularly well suited for use in a digital frequency synthesizer of the type having a phase locked loop.

BRIEF DESCRIPTION OF THE DRAWINGS

FIG. 1 is a schematic diagram of the first embodiment of the present invention having a binary down counter;

FIG. 2 is a schematic diagram of a second embodiment of the present invention having a binary up counter;

FIG. 3 is a schematic diagram of the dual modulus counter of the present invention controlling two programmable dividers; and FIG. 4 is a schematic diagram of a phase locked loop utilizing a variable divider.

DETAILED DESCRIPTION OF THE INVENTION

FIG. 1 illustrates a schematic diagram of the first embodiment of the present invention. In the first embodiment, there is shown a dual modulus counter having a binary down counter 12 which is loaded at the beginning of a count sequence with the value N1. There is a prescaler 11 which can divide by the ratios R1 or R2. The output pulses of the prescaler 11 decrement the down counter 12 until the down counter reaches the value zero. When the down counter 12 reaches zero, it generates an output pulse which sets a latch 14. The setting of the latch 14 causes the prescaler 11 to switch to its alternative division ratio R2. The output pulses of the prescaler 11 continue to decrement the down counter 12 until a comparator 13 detects that it has reached the state corresponding to a value −N2. When the comparator 13 detects the value −N2, the latch 14 is already set, and both inputs to an AND gate 15 are enabled. The AND gate 15 then generates an output signal which is clocked into a d-type flip flop 16 upon the next prescaler output pulse. The latch 14 is then reset, and the down counter 12 can be reloaded with the value N1, while the prescaler 11 resumes division by the ratio R1.

Since the inputs to the AND gate 15 are no longer enabled because the latch 14 has been reset, the output signal at the AND gate 15 will disappear and this state will be transferred into the d-type flip flop 16 upon the next output pulse of the prescaler 11. The preset control signal to the down counter 12 is removed leaving it loaded with the value N1 and ready for the next count sequence. The total number of prescaler input pulses in the count sequence, therefore is expressed by the equation $N_{TOT}=(N1+1)R1+(N2+1)R2$. In order to obtain a desired $N_{TOT}$, it is necessary to subtract the excess R1+R2 value from the desired number. For example, if R1=11 and R2=10, and a total division cycle length of 170 is desired, 10+11=21 is first subtracted from 170 resulting in the value 149. N1 must then be 9 and N2=14−9=5. In order to avoid impossible negative values of N2 arising, a desired count N must satisfy the following equations:

$$\text{INT}\{(N-R1-R2)/R2\} \geq |N-R1-R2|_{R2}$$

$$\text{INT}\{(N-R1-R2)/R1\} \geq |N-R1-R2|_{R1}$$

The expression INT (x) means the whole number part of x, i.e., if x=5.3667, then INT(x)=5. This is an expression of the above-described lower bound on the contiguous number range that can be spanned using the dual ratio prescalers associated with the present invention.

In the circuit illustrated in FIG. 1, there is no restriction placed on the relative magnitudes of N1 and N2. The word length of the comparator 13 was the same as the whole number in the counter 12. However, to cover a range of values of N in steps of 1 with no gaps only requires that N1+1 take on values between 1 and R1−1 i.e., the range of the least significant digit of N modulo R1. Since this range is often much shorter than the total length of the counter 12, the comparator 13 word length can be advantageously reduced. The reduction of the word length of the comparator 13 can be achieved by using an up counter.

Referring now to FIG. 2, a second embodiment of the present invention using an up counter is illustrated. In the second embodiment of the present invention, there is a preloadable binary up counter 22 that is responsive to the output of a prescaler 21. The prescaler 21 is capable of dividing by division ratios R1 or R2. The up counter 22 is initially preset to a value −N1, while the prescaler 21 is initially set to divide by R1. The output pulses of the prescaler 21 increment the up counter 22 until the output of the up counter reaches all logical ones. When the output of the up counter 22 is all logical ones instead of all logical zeros, the output can be more rapidly detected.

Upon detecting all logical ones, a latch 24 is set causing the prescaler 21 to switch to division by the ratio R2. If N2 equals 111..1, an L-bit comparator 23 provides an output signal to an AND gate 25. The AND gate 25 generates an output signal. Otherwise the L-bit comparator 23 generates an output signal after one further output pulse from the prescaler 21 if N2=0, after two output pulses if N2=1, etc. On the immediately following prescaler output pulse, the output of AND gate 25 is clocked into a d-type flip flop 26 causing the latch 24 to be reset. The prescaler 21 returns to dividing by R1, and the up counter is reloaded with the value −N1. Since the resetting of the latch 24 removes one of the enabling inputs to the AND gate 25, the output of the AND gate becomes 0. This output is transferred to the d-type flip flop 26 on the next prescaler output pulse, thereby removing the reload control signal to the up counter 22 and leaving it in the state −N1 and leaving it ready to repeat the entire cycle.

The total number of prescaler input clock pulses in a complete division cycle for the circuit of FIG. 2 is defined by the equation $N=N1\times R1+(N2+2)\times R2$. It should be noted, however, that the value N2=−1 is correctly treated by the circuit, so that N2 is considered to range through the values −1, 0, +1 ... to $2^{**}L-2$. The value N2' is defined by the equation $N2'=N2+1$ and ranges from the value 0 to $2^L-1$. The value N is defined by the equation $N=N1\times R1+N2'\times R2+R2$. The values for N1 and N2' may be calculated as follows: (1) Subtract the excess R2 from N to get N', (2) calculate N2' as the remainder upon division of N' by R1, (3) calculate N1 as the integer part of $N'/R1-N2'$, and (4) apply N2=N2'−1 to the L-bit comparator 23 and N1 to the divider preload input of counter 22. These manipulations can be performed more simply if the value R1 is a power of 2.

Referring now to FIG. 3, a schematic diagram illustrates a plurality of programmable dividers or prescalers 30, 31 being controlled by the dual modulus counter of the present invention. Two digital comparators 35, 36 are used to examine the state of the least significant L-bits of a main counter 37. After counting up from a value −N1 to an all logical ones condition, the comparators 35, 36 in turn detect when the least significant bits of the main counter 37 becomes equal to N2 and then to the value N3. These events cause the prescalers 30 and 31 respectively to divide by their alternative ratios.

For example, suppose the prescaler 31 has the ratios 10 and 11 available, while the prescaler 30 has ratios of 9 and 10 available. Assuming that the flip flops 38, 39 and 40 are in the reset condition, both prescalers 30, 31 begin by dividing by 10. The counter 37 then counts up from $-N1$ until its output is all logical ones. The latch 38 then becomes set, causing the prescaler 31 to divide by 11. The counter 37 continues to count up until the comparator 36 detects a state corresponding to the value N2. If latch 38 is also set, both inputs to an AND gate 41 are enabled and the latch 39 is set. This causes the prescaler 30 to begin dividing by 9 while the prescaler 31 continues to divide by 11. The counter 37 continues to count until the comparator 35 detects a bit state corresponding to the value N3. At this point, if latch 39 is already set, both inputs to the AND gate 42 are enabled and upon the next output pulse from the prescaler 31 the output signal of the AND gate 42 is clocked into the flip flop 40, causing the latches 38, 39 to be reset and the reloading of the main counter 37 to the starting state N1. The prescalers 30, 31 are now back in their original divide by 10 condition, and the inputs to the AND gate 42 are no longer enabled. After one more pulse from the prescaler 31, the zero signal from the AND gate 42 is transferred into the flip flop 40 removing the reset condition and leaving the counter 37 in the state $-N1$ and ready to start a new cycle.

The total cycle length in terms of output pulses of the input clock signal $F_c$ can be expressed by the following equation:

$$N = 100N1 + 110(N2+1) + 99(|N3-N2|+1)$$

where the absolute value of $N3-N2$ corresponds to modulo $2^{**}L$, where L is the number of least significant bits of the counter 37 examined by the comparators 35, 36. The value $N3'$ is defined by the equation $N3' = N3 - N2$. The value of N, therefore, can be defined by the following equation:

$$N = 100(N1+N2) + 110(N2+1) + 10N2 - N3' + 209$$

A desired count may be produced in the following fashion, (1) subtract the excess 209 from the desired count, getting N', (2) round up N' to the next multiple of 10, which is called N", (3) set N3' to (N"−N'), (4) set N2 to the 10's digit of N", and (5) set N1 to the 100's digit of N'−N2. For example, suppose N=1,568. Then N'=1,568−209=1,359. N"=1,360. N3'=N"−N'=1. N2=6(10's digit of N"). N1=13−N2=7(100's digit N"−N2). Because of the subtraction of N2 from the number of 100's in N" and the value of N2 ranges up to 9, the number of 100's in N" can not be less than 9. Therefore the lower bound on the contiguous number range is of the order $900+(209-9)=1,100$. This is an order of magnitude lower than the lower bound of 9,900 that would apply for a two-ratio prescaler of ratios 100 and 101. In general, an advantageous way to obtain a total frequency reduction of the order of $R^{**}2$ from the input clock signal $F_c$ to the input of the low frequency divider is to use two prescalers having the ratios (R, R+1) and (R, R−1) respectively.

The principles of the present inventions may be extended by adding additional comparators as necessary. The comparators are not constrained to be of the same word length and bits, nor are the prescalers they control constrained to exist separately. The two prescalers 30, 31 of FIG. 3 can also be regarded as a single circuit having three or more division ratios selectable by two or more control lines. Such an arrangement can be advantageous because the exact moment at which the highest frequency prescaler 30 is switched between its ratios can be more time critical than the lower frequency logic can define. It is, therefore, possible that a necessary precaution is to retime the control signal to the highest frequency prescaler with the logic having substantially the same speed as prescaler 31. The control signal from the low speed logic, therefore, should preferably pass through the medium speed prescaler 31 to be retimed more accurately. This will have a small penalty on the lower bound of the contiguous number range that the overall division ratios can span, but it will increase the maximum frequency of operation before timing problems are encountered.

The prescaler division ratios of the present invention are not constrained to any particular values. Common values that simplify the calculation of the values N1, N2, and N3 can be based on either a decimal number system or a binary number system. In cases where the ease of calculation is not an issue such as when adequate microprocessor capability exists for number radix manipulations or when precomputed lookup tables can be used, it may be possible to find other advantageous combinations of prescaler ratios, e.g. noncommensurate primes.

Referring now to FIG. 4, a schematic diagram illustrates the use of the present invention in a phase locked loop. The phase locked loop includes a voltage controlled oscillator 50 which provides an output signal $F_0$. The output signal $F_0$ is applied to a variable divider circuit 51. The variable divider circuit 51 includes a programmable divider and the dual modulus counter of the present invention. The total division ratio N of the variable divider circuit 51 is a function of the values N1 and N2 associated with the dual modulus counter. The output of the variable divider circuit 51 is a divided output signal $F_0/N$ which is applied to a phase comparator 52. The phase comparator 52 compares the phase of the divided output signal $F_0/N$ to a divided reference frequency signal $F_r/M$. The divided reference frequency signal is produced from a reference clock signal that is divided by a digital divider 53. The output of the phase comparator 52 is a signal representative of the phase error. The phase error signal is applied to a loop filter/integrator 54. The filtered and integrated output is then applied to the voltage controlled oscillator 50.

While the invention has been described in its preferred embodiments, it is to be understood that the words that have been used are words of description rather than of limitation and that changes within the purview of the appended claims may be made without departing from the true scope and spirit of the invention in its broader aspects.

I claim:

1. A variable ratio frequency divider circuit comprising:
    programmable dividing means, having division ratios R1 and R2, for dividing an input signal into a divided output signal;
    counting means, having a relatively long word length, responsive to a predetermined value N1 and the divided output signal of the programmable dividing means, for generating a plurality of outputs including a predetermined intermediate output;

first comparing means, having a relatively short word length, for comparing the output of said counting means to a second predetermined value N2 and for generating an output when the output of said counting means corresponds to the value N2; and logic means, responsive to said counting means and said comparing means, for generating selection signals for the programmable dividing means such that the programmable dividing means divides the input signal by the ratio R1, N1 times and by the ratio R2, N2 times.

2. A variable ratio frequency divider circuit according to claim 1 wherein said counting means is a binary up counter and the intermediate output is all logical ones.

3. A variable ratio frequency divider circuit comprising:

programmable dividing means, having division ratios R1 and R2, for dividing an input signal into a divided output signal;

counting means, responsive to a predetermined value N1 and the divided output signal of the programmable dividing means, for generating a plurality of outputs including a predetermined intermediate output;

first comparing means for comparing the output of said counting means to a second predetermined value N2 and for generating an output when the output of said counting means corresponds to the value N2;

logic means, responsive to said counting means and said comparing means, for generating selection signals for the programmable dividing means such that the programmable dividing means divides the input signal by the ratio R1, N1 times and by the ratio R2, N2 times;

second programmable dividing means having division ratios R3 and R4, for dividing the input signal; and second comparing means for comparing the output of said counting means to a third predetermined value N3 and for generating an output when the output of said counting means corresponds to the value N3.

4. A variable ratio frequency divider circuit comprising:

programmable dividing means, having division ratios R1 and R2, for dividing an input signal into a divided output signal;

counting means, responsive to a predetermined value N1 and the divided output signal of the programmable dividing means, for generating a plurality of outputs including a predetermined intermediate output, wherein said counting means is a binary down counter and the intermediate output is zero;

first comparing means for comparing the output of said counting means to a second predetermined value N2 and for generating an output when the output of said counting means corresponds to the value N2; and logic means, responsive to said counting means and said comparing means, for generating selection signals for the programmable dividing means such that the programmable dividing means divides the input signal by the ratio R1, N1 times and by the ratio R2, N2 times; wherein said logic means includes first latching means responsive to said counting means; an AND gate responsive to said first latching means and said first comparing means; and second latching means responsive to said AND gate and said divided output signal.

5. A variable ratio frequency divider circuit according to claim 2 wherein said logic means includes first latching means responsive to said counting means; an AND gate responsive to said first latching means and said first comparing means; and second latching means responsive to said AND gate and said divided output signal.

6. A variable ratio frequency divider circuit according to claim 3 wherein said logic means includes a first latching means responsive to said counting means; a first AND gate responsive to said first latching means and said first comparing means; second latching means responsive to said first latching means and said first AND gate; a second AND gate responsive to said second latching means and said second comparing means; and third latching means responsive to said second AND gate and the divided output signal.

7. A method of using a single digital counter with a limited maximum operating frequency to control a preceding higher frequency stage having two available division ratios R1 and R2, which comprises the steps of:

counting from a value N1 having a relatively long word length which is determined by an initial state to which the digital counter is set, while the preceding higher frequency stage is set to divide by R1;

reaching a conveniently detectable state, such that the preceding higher frequency stage has divided by R1, N1 times;

changing the division ratio to a value R2 after reaching the conveniently detectable state; and continuing to divide by the ratio R2 until the digital counter is detected by a comparator to have reached a state corresponding to the value N2 having a relatively short word length such that the preceding higher frequency stage divides by the ratio R2, N2 times.

8. A method according to claim 7 which further includes the step of varying the values of N1 and N2 such that the overall division ratio N varies in steps of one over a range of contiguous values.

9. A method of using a single digital counter of limited maximum frequency to control at least one preceding higher frequency stage that is set to divide by integer ratios which comprises the steps of:

setting the digital counter to a starting state having a relatively long word length;

comparing the state of the digital counter to a plurality of states including a state having a relatively short word length in a digital comparator in order to detect when the digital counter has reached a desired state;

selecting between the integer ratios when the digital counter has reached the desired state;

registering the desired state in logic means;

controlling the selection of the integer ratio used by the preceding higher frequency stage in accordance with the state of the logic means; and resetting the logic means to its starting state and the digital counter to its starting state in order to repeat the sequence.

10. A method according to claim 9 which further includes the step of varying the states of the digital counter and the comparator such that an overall division ratio N is varied continuously in steps of one over a range of values.

11. A phase locked loop comprising:
 a voltage controlled oscillator for generating an output;
 variable dividing means for dividing the output of said voltage controlled oscillator, said variable dividing means including;
  programmable dividing means having division ratios R1 and R2, for dividing an input signal into a divided output signal;
  counting means, responsive to a predetermined value N1 having a relatively logic word length and the divided output signal of the programmable dividing means, for generating an output including a predetermined intermediate output;
  comparing means for comparing the output of said counting means to a second predetermined value N2 having a relatively short word length and for generating an output when the output of said counting means corresponds to the value N2; and
  logic means, responsive to said counting means and said comparing means, for generating selection signals for the programmable dividing means such that the programmable dividing means divides the clock signal by the ratio R1, N1 times and by the ratio R2, N2 times; and
 phase comparison means for comparing the divided output signal of said variable dividing means to a reference signal to generating a phase error signal which si supplied to said voltage controlled oscillator.

12. A phase locked loop according to claim 11 which further includes means for filtering the phase error signal and means for integrating the phase error signal.

13. A phase locked loop according to claim 12 which further includes dividing means for dividing the reference signal prior to its application to said phase comparison means.

14. A variable ratio frequency divider circuit comprising:
 a plurality of programmable dividing means, having division ratios R1 to Rq, for dividing an input signal into divided output signals;
 counting means, responsive to predetermined values N1 to Nq and the divided output signals of the programmable dividing means, for generating a plurality of outputs including a predetermined intermediate output;
 a plurality of comparing means for comparing the output of said counting means to predetermined values of N and for generating an output when the output of said counting means corresponds to the value Nq; and
 logic means, responsive to said counting means and said comparing means, for generating selection signals for the programmable dividing means such that the programmable dividing means divides the input signal by the ratios R1 to Rq.

* * * * *